United States Patent
Xu et al.

(10) Patent No.: US 9,712,169 B2
(45) Date of Patent: Jul. 18, 2017

(54) TRANSMIT POWER MEASUREMENT APPARATUS HAVING PROGRAMMABLE FILTER DEVICE THAT IS SET AT LEAST BASED ON FREQUENCY RESPONSE OF TRANSMIT POWER DETECTION PATH AND RELATED TRANSMIT POWER MEASUREMENT METHOD THEREOF

(71) Applicant: MediaTek Singapore Pte. Ltd., Singapore (SG)

(72) Inventors: Bing Xu, Gilbert, AZ (US); Li-Shin Lai, Taipei (TW); Chi-Hsueh Wang, Kaohsiung (TW); Hsiang-Hui Chang, Miaoli County (TW)

(73) Assignee: MediaTek Singapore Pte. Ltd., Singapore (SG)

( * ) Notice: Subject to any disclaimer, the term of this patent is extended or adjusted under 35 U.S.C. 154(b) by 617 days.

(21) Appl. No.: 14/279,336

(22) Filed: May 16, 2014

(65) Prior Publication Data
US 2014/0350872 A1    Nov. 27, 2014

Related U.S. Application Data

(60) Provisional application No. 61/825,630, filed on May 21, 2013.

(51) Int. Cl.
*G01R 21/06* (2006.01)
*G01R 23/00* (2006.01)
(Continued)

(52) U.S. Cl.
CPC ..... *H03K 19/017509* (2013.01); *G01R 21/06* (2013.01); *G01R 23/00* (2013.01); *H03F 1/24* (2013.01); *H03F 3/2178* (2013.01); *H03K 19/017581* (2013.01); *H03M 1/12* (2013.01); *H04B 1/04* (2013.01); *H04B 1/0475* (2013.01); *H04L 7/0037* (2013.01); *H04L 7/0091* (2013.01); *H04L 25/028* (2013.01); *H04L 25/08* (2013.01); *H04L 27/2053* (2013.01);
(Continued)

(58) Field of Classification Search
CPC . H03K 19/017509; H03F 3/2178; H03F 1/24; H03F 2203/21154; H04B 1/04; H04B 1/0475; H04B 2001/0408; H04L 25/08; H04L 7/0037; H04L 27/2067; G01R 21/06
USPC .............. 702/60; 369/44.34, 44.27
See application file for complete search history.

(56) References Cited

U.S. PATENT DOCUMENTS

| 6,166,598 A * | 12/2000 | Schlueter ............... H01Q 11/12 330/127 |
| 7,215,972 B2 * | 5/2007 | Premakanthan ..... H03G 3/3047 370/310 |
| 2010/0164648 A1 | 7/2010 | Kravitz |

FOREIGN PATENT DOCUMENTS

| CN | 1230089 A | 9/1999 |
| CN | 103095332 A | 5/2013 |

* cited by examiner

*Primary Examiner* — Carol S Tsai
(74) *Attorney, Agent, or Firm* — Winston Hsu

(57) ABSTRACT

A transmit power measurement apparatus includes a transmit power detection path, a compensation circuit and a tracking circuit. The compensation circuit includes a programmable filter device and a compensation controller. The programmable filter device generates a filter output. The compensation controller sets the programmable filter device at least based on a frequency response of the transmit power detection path. The tracking circuit generates a transmit power tracking result at least based on the filter output.

20 Claims, 7 Drawing Sheets

(51) Int. Cl.
*H03K 19/0175* (2006.01)
*H03F 3/217* (2006.01)
*H04L 27/34* (2006.01)
*H04B 1/04* (2006.01)
*H04W 24/02* (2009.01)
*H04L 25/02* (2006.01)
*H04L 25/08* (2006.01)
*H03M 1/12* (2006.01)
*H04L 7/00* (2006.01)
*H03F 1/24* (2006.01)
*H04L 27/20* (2006.01)

(52) U.S. Cl.
CPC ...... *H04L 27/2067* (2013.01); *H04L 27/3411* (2013.01); *H04L 27/3444* (2013.01); *H04W 24/02* (2013.01); *H03F 2203/21154* (2013.01); *H04B 2001/045* (2013.01); *H04B 2001/0408* (2013.01)

TRANSMIT POWER MEASUREMENT APPARATUS HAVING PROGRAMMABLE FILTER DEVICE THAT IS SET AT LEAST BASED ON FREQUENCY RESPONSE OF TRANSMIT POWER DETECTION PATH AND RELATED TRANSMIT POWER MEASUREMENT METHOD THEREOF

CROSS REFERENCE TO RELATED APPLICATIONS

This application claims the benefit of U.S. provisional application No. 61/825,630, filed on May 21, 2013 and incorporated herein by reference.

BACKGROUND

The disclosed embodiments of the present invention relate to a transmit power control mechanism, and more particularly, to a transmit power measurement apparatus having a programmable filter device that is set at least based on a frequency response of a transmit power detection path and a related transmit power measurement method thereof.

Mobile communication has changed the way people communicate. Mobile phone has been transformed from a luxury item into an essential part of everyday life. Many wireless communication protocols have been proposed to realize the mobile communications. For example, the mobile phone may support at least one of wireless communication protocols such as the fourth generation (4G) wireless communication protocol (e.g., Long Term. Evolution (LTE) technology or LTE Advanced (LTE-A) technology) and the third generation (3G) wireless communication protocol (e.g., Wideband Code Division Multiple Access (WCDMA) technology or Time Division-Synchronous Code Division Multiple Access (TD-SCDMA) technology).

Generally, after a digital-to-analog conversion of raw data to be transmitted by a transmitter of a wireless communication device (e.g., mobile phone), the analog transmit signal is coupled through analog components, such as one or more analog filters, a passive mixer, one or more drivers and a power amplifier. There may be other stages as well. Further, one or more of these analog components may have variable gain properties in order to adjust the gain of the signal at various stages of the transmit path. In other words, the transmitter includes a form of gain control used to control the strength of the radio frequency (RF) signal transmitted from the wireless communication device. The gain control is generally divided into discrete chunks, called "gain steps".

The 3G/4G wireless communication protocols allow a maximum error of −/+0.5 dB in gain over all conditions (e.g., temperature, process, supply voltage, etc.) when a 1 dB power level change is made. This gain step accuracy should be met over the entire transmitter power control range. In addition, the tracking accuracy of the power control algorithm should be −/+0.1 dB. In general, a transmit power detection path may be coupled to the power amplifier output though a coupler, such that an RF sensing input is received and processed by the transmit power detection path to generate a transmit power detection signal. The transmit power detection path includes analog components and therefore has a gain setting. Hence, a power measurement error may result from gain asymmetry of the transmit power detection path. For example, the power measurement error may be an absolute measurement error in a narrow bandwidth transmission, a larger measurement variation in a wide bandwidth transmission, or both of the above in the presence of baseband (BB) hopping. Specifically, the gain asymmetry shape (i.e., gain versus frequency) varies with different gain settings, and moves up/down with temperature variation. FIG. 1 is a diagram illustrating the frequency response of the transmit power detection path. When the transmit power detection path has the first gain setting, the frequency response curve CV1 is not flat and asymmetrical around the carrier frequency with frequency offset equal to zero. When the transmit power detection path has the second gain setting, the frequency response curve CV2 is not flat and asymmetrical around the carrier frequency with frequency offset equal to zero. As shown in FIG. 1, the frequency response curve CV1 is different from the frequency response curve CV2.

Thus, there is a need to cancel/mitigate the power measurement error resulting from the gain asymmetry of the transmit power detection path.

SUMMARY

In accordance with exemplary embodiments of the present invention, a transmit power measurement apparatus having a programmable filter device that is set at least based on a frequency response of a transmit power detection path and a related transmit power measurement method thereof are proposed to solve the above-mentioned problem.

According to a first aspect of the present invention, an exemplary transmit power measurement apparatus is disclosed. The exemplary transmit power measurement apparatus includes a transmit power detection path, a compensation circuit and a tracking circuit. The compensation circuit includes a programmable filter device and a compensation controller. The programmable filter device is configured to generate a filter output. The compensation controller is configured to set the programmable filter device at least based on a frequency response of the transmit power detection path. The tracking circuit is configured to generate a transmit power tracking result at least based on the filter output.

According to a second aspect of the present invention, an exemplary transmit power measurement method is disclosed. The exemplary transmit power measurement method includes: setting a programmable filter device at least based on a frequency response of a transmit power detection path; generating a filter output by utilizing the programmable filter device; and generating a transmit power tracking result at least based on the filter output.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The present invention proposes a transmit power measurement apparatus which performs a calibration operation for learning the frequency response curve of the transmit power detection path, performs a compensation operation for equalizing or duplicating the impaired power detection path frequency response, and performs a tracking operation for obtaining a more accurate power measurement result. In this way, the power measurement error resulting from gain asymmetry of the transmit power detection path is cancelled or mitigated, thus leading to enhanced power control accuracy. In addition, the compensation operation is programmable. The proposed transmit power measurement apparatus is capable of handling multiple modes (e.g., LTE-A, LTE, WCDMA, TD-SCDMA, etc.) with various signal bandwidths. Further details of the proposed transmit power measurement apparatus are described as below.

Figure 1:
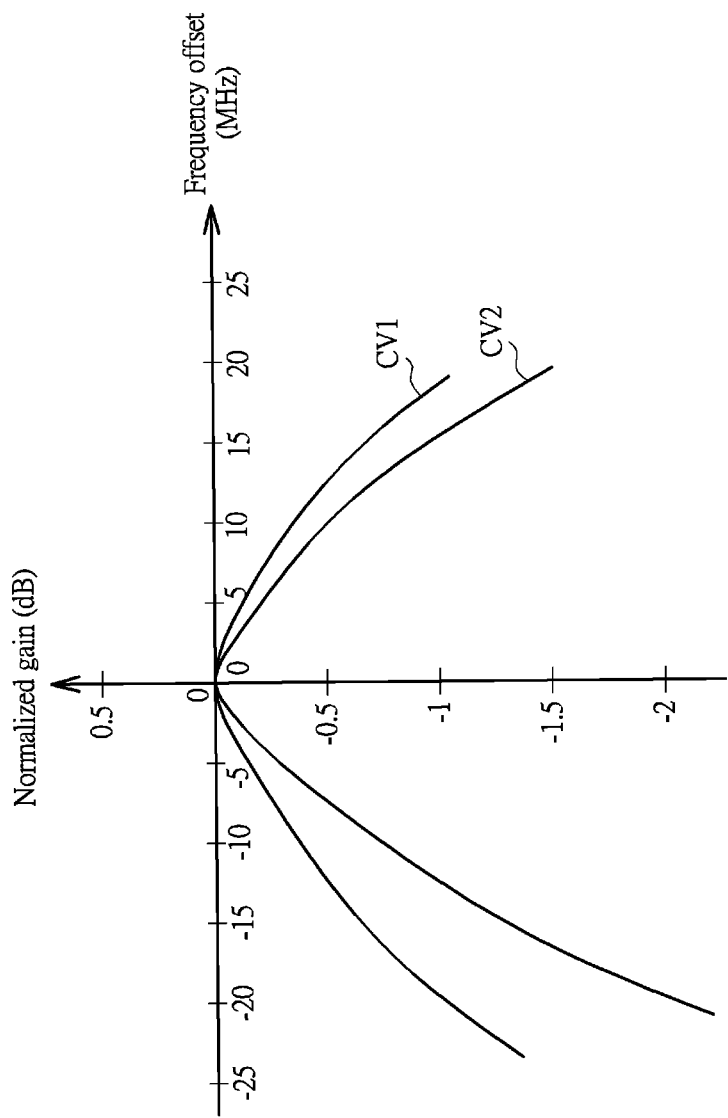
FIG. 1 is a diagram illustrating a frequency response of a transmit power detection path.
Figure 2:
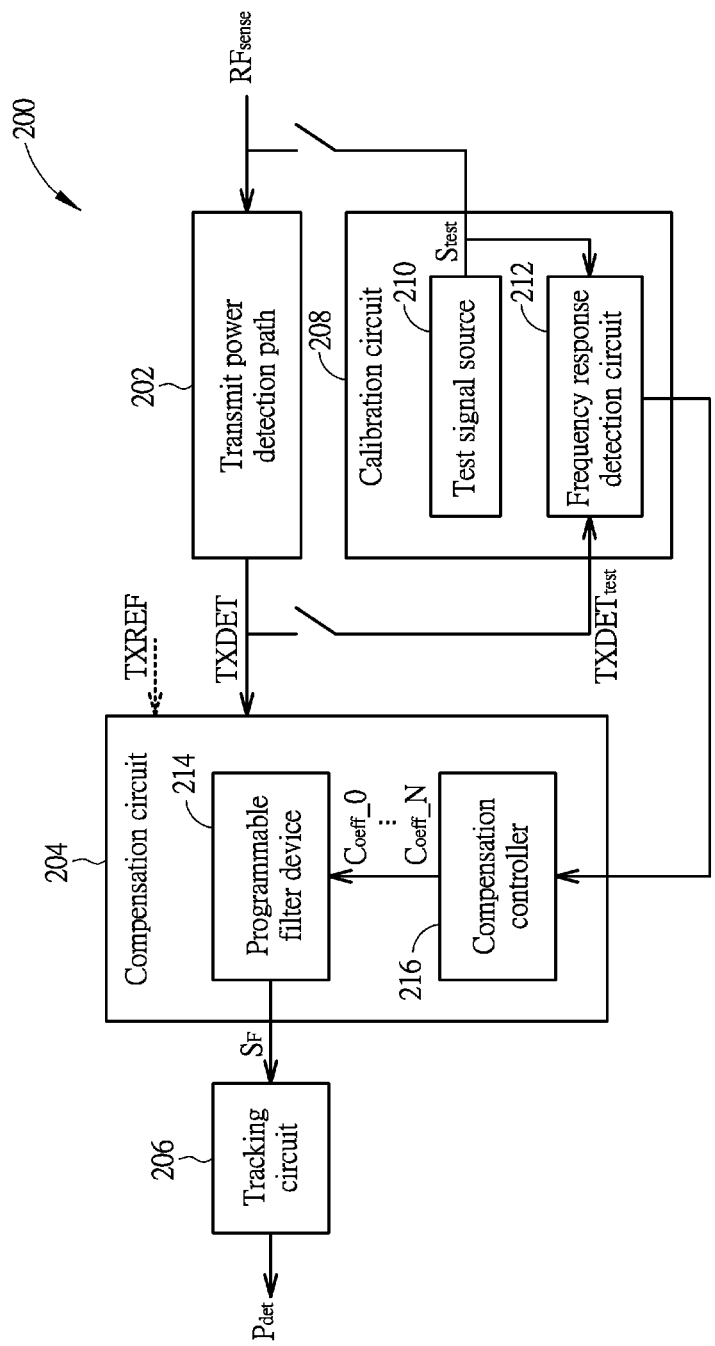
FIG. 2 is a block diagram illustrating a transmit power measurement apparatus according to an embodiment of the present invention.

FIG. 2 is a block diagram illustrating a transmit power measurement apparatus according to an embodiment of the present invention. The transmit power measurement apparatus 200 may be employed by a mobile phone using a multi-mode transmitter. The transmit power measurement apparatus 200 includes, but is not limited to, a transmit power detection path 202, a compensation circuit 204, a tracking circuit 206 and a calibration circuit 208. The transmit power detection path 202 may be operated in a normal mode or a calibration mode. When the transmit power detection path 202 is operated in the normal mode, it receives an RF sensing input $RF_{sense}$ generated from a coupler (not shown) that senses an RF output (e.g., a power amplifier output) to be transmitted via an antenna (not shown), and processes the RF sensing input $RF_{sense}$ to generate a transmit power detection signal TXDET. When the transmit power detection path 202 is operated in the calibration mode, it receives a test transmit signal $S_{test}$, and processes the test transmit signal $S_{test}$ to generate a test transmit power detection signal $TXDET_{test}$.

In this embodiment, the calibration circuit 208 includes a test signal source 210 and a frequency response detection circuit 212. When the transmit power detection path 202 is operated in the calibration mode, the calibration circuit 208 is connected to the transmit power detection path 202. When the transmit power detection path 202 is operated in the normal mode, the calibration circuit 208 is disconnected from the transmit power detection path 202. Specifically, when the transmit power detection path 202 is operated in the calibration mode, the calibration circuit 208 is enabled to learn the frequency response of the transmit power detection path 202 under different test conditions.

The test signal source 210 is configured to generate the test transmit signal $S_{test}$ to the transmit power detection path 202. For example, the test signal source 210 may be a tone generator used to generate a single tone signal and vary the frequency of the single tone signal during the calibration process. For another example, the test signal source 210 may be a white noise generator. The frequency response detection circuit 212 is configured to receive the test transmit power detection signal $TXDET_{test}$ generated from the transmit power detection path 202 in response to the test transmit signal $S_{test}$, and obtain at least one detected frequency response of the transmit power detection path 202 according to the test transmit signal $S_{test}$ and the test transmit power detection signal $TXDET_{test}$. For example, the at least one detected frequency response may include a plurality of frequency responses determined by the frequency response detection circuit 212 under different gain settings (i.e., gain steps) of the transmit power detection path 202. That is, one frequency response curve is learned when analog components of the transmit power detection path 202 are properly controlled to make the transmit power detection path 202 have a first gain setting, and another frequency response curve is learned when analog components of the transmit power detection path 202 are properly controlled to make the transmit power detection path 202 have a second gain setting. For another example, the at least one detected frequency response may include a plurality of frequency responses determined by the frequency response detection circuit 212 under different operating bands. That is, one frequency response curve is learned when the test transmit signal $S_{test}$ is a single tone signal controlled to sweep different frequencies in a first frequency band, and another frequency response curve is learned when the test transmit signal $S_{test}$ is a single tone signal controlled to sweep different frequencies in a second frequency band. The frequency response detection circuit 212 may have a storage device (e.g., a non-volatile memory) and store each learned frequency response of the transmit power detection path 202 for later use.

The compensation circuit 204 is coupled between the tracking circuit 206 and the transmit power detection path 202. In this embodiment, the compensation circuit 204 includes, but is not limited to, a programmable filter device 214 and a compensation controller 216. The programmable filter device 214 may be implemented using a single filter or a group of filters. In one power measurement configuration, the programmable filter device 214 may be used to generate a filter output $S_F$ by applying asymmetric frequency response to digitized samples of the transmit power detection signal TXDET. In another power measurement configuration, the programmable filter device 214 may be used to receive a reference transmit signal TXREF, and generate the filter output $S_F$ by applying asymmetric frequency response to the reference transmit signal TXREF. The reference transmit signal TXREF includes raw data transmitted by the transmitter. Hence, the RF sensing signal $RF_{sense}$ is obtained from sensing an RF output corresponding to the raw data.

The compensation controller 216 is configured to set the programmable filter device 214 at least based on the frequency response of the transmit power detection path 202. In this embodiment, the detection path frequency response used by the compensation controller 216 is selected from the frequency responses determined by the frequency response detection circuit 212. As mentioned above, the calibration circuit 208 may learn a plurality of frequency response curves under different test conditions. The compensation controller 216 may adjust the filter coefficients $C_{oeff\_}0$-$C_{oeff\_}N$ based on one or more factors. For example, the factors may include the operating band of the transmitter, the carrier aggregation (CA) use case, the transmitter power level and corresponding detection path gain setting, and/or the sampling rate of the analog-to-digital converters (ADCs) on the detection path.

In this embodiment, the tracking circuit 206 is configured to generate a transmit power tracking result $P_{det}$ at least based on the filter output $S_F$. That is, the transmit power tracking result $P_{det}$ is indicative of the transmit power level. The power measurement apparatus 200 is part of a power control loop. Hence, the power control loop adjusts the transit power of the transmitter based on the transmit power tracking result $P_{det}$.

Figure 3:
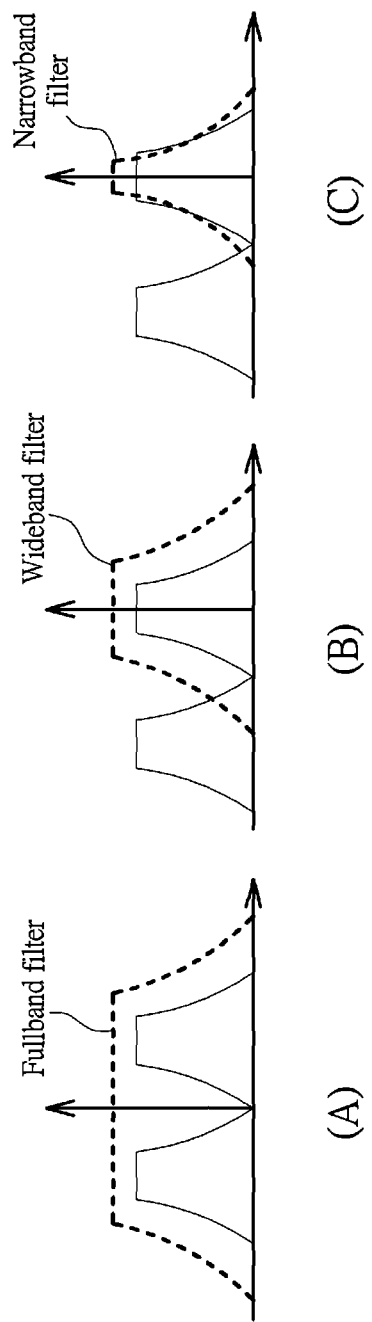
FIG. 3 is a diagram illustrating power measurement under different bandwidth settings of the programmable filter device.

It should be noted that the clock of the ADC on the detection path is derived from a local oscillator, and varies with the band channel. This may call for programmability on the digital filtering. In an embodiment of the present invention, the programmable filter device 214 may be used as a digital filter configured for allowing measurement of transmit power across the total assigned bandwidth. As shown in the sub-diagram (A) of FIG. 3, the programmable filter device 214 may be set by the compensation controller 216 to act as a fullband filter. In this way, the transmit power of all multiple carriers within the assigned bandwidth can be measured to decide the transmit power tracking result $P_{det}$ for power control. In another embodiment of the present invention, the programmable filter device 214 may be used as a digital filter configured for allowing measurement of transmit power within a portion of the assigned bandwidth, which relaxes the signal bandwidth requirement of power measurement. As shown in the sub-diagram (B) of FIG. 3, the programmable filter device 214 may be set by the compensation controller 216 to act as a wideband filter. In this way, only the transmit power of a single carrier within the assigned bandwidth is measured to decide the transmit power tracking result $P_{det}$ for power control. Alternatively, as shown in the sub-diagram (C) of FIG. 3, the programmable filter device 214 may be set by the compensation controller 216 to act as a narrowband filter. In this way, only the transmit power of a portion of a single carrier within the assigned bandwidth is measured to decide the transmit power tracking result $P_{det}$ for power control.

The transmit power detection path 202 may support a plurality of gain settings (i.e., gain steps) and switch between the gain settings according to the transmit power level of the transmitter. In one exemplary design, the calibration circuit 208 is configured to learn a plurality of frequency response curves of the transmit power detection path 202 for the gain steps of the transmit power detection path 202, respectively. When the transmit power detection path 202 is configured to have one of the gain steps, the corresponding learned frequency response of the transmit power detection path 202 is selected and used to set the filter coefficients. In other words, the compensation controller 216 is operative to adjust the filter coefficients each time the gain step of the transmit power detection path 202 is adjusted. To reduce the hardware complexity, the compensation controller 216 may be configured to set the programmable filter device 214 by a first set of filter coefficients for each gain step included in a first group of gain steps of the transmit power detection path 202, and set the programmable filter device 214 by a second set of filter coefficients for each gain step a second group of gain steps of the transmit power detection path 202. In another exemplary design, the first set of filter coefficients may be derived from at least a portion (i.e., part or all) of learned frequency responses of the first group of gain steps, and the second set of filter coefficients may be derived from at least a portion (i.e., part or all) of learned frequency responses of the second group of gain steps. Hence, the compensation controller 216 is not required to adjust the filter coefficients frequently.

Figure 4:
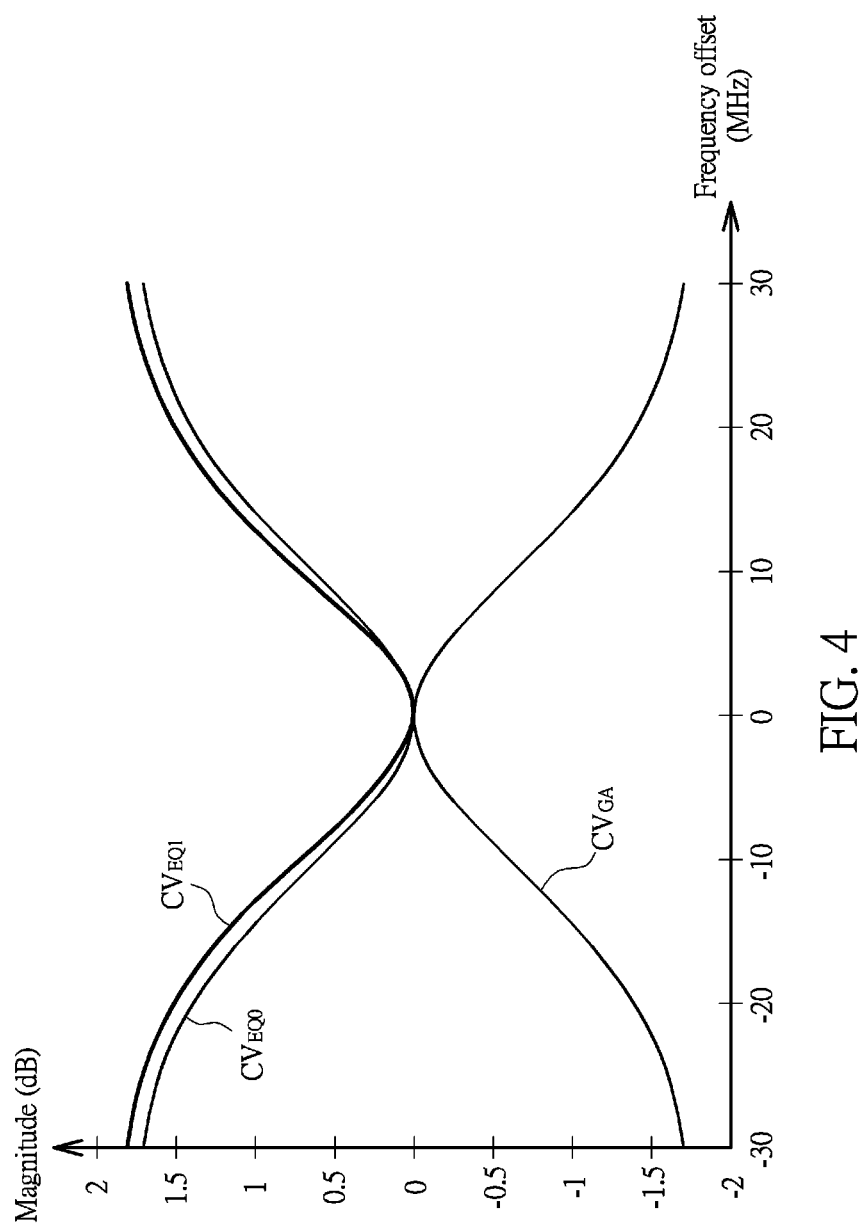
FIG. 4 is a diagram illustrating the frequency response of the transmitter power detection path, the frequency response of the programmable filter device with filter coefficients adjusted for each gain step of the transmitter power detection path, and the frequency response of the programmable filter device with filter coefficients adjusted for each group of gain steps of the transmitter power detection path.

FIG. 4 is a diagram illustrating the frequency response $CV_{GA}$ of the transmitter power detection path 202, the frequency response $CV_{EQ0}$ of the programmable filter device 214 with filter coefficients adjusted for each gain step of the transmitter power detection path, and the frequency response $CV_{EQ1}$ of the programmable filter device 214 with filter coefficients adjusted for each group of gain steps of the transmitter power detection path. The frequency response $CV_{GA}$ of the transmitter power detection path 202 is modeled under a specific gain step. The frequency response $CV_{EQ0}$ is particularly designed for the specific gain step, such that the frequency response of the transmitter power detection path 202 and the programmable filter device 214 is flattened when the transmit power detection signal TXDET is processed by the programmable filter device 214. The frequency response $CV_{EQ1}$ is not particularly designed for the specific gain step. Hence, the frequency response of the transmitter power detection path 202 and the programmable filter device 214 may be slightly deviated from a flat frequency response. However, with proper settings of the first set of filter coefficients and the second set of filter coefficients, the power measurement error may still meet the tracking accuracy requirement (e.g., −/+0.1 dB). The following table shows a measurement accuracy comparison of different measurement conditions.

| | RFFE gain | IF gain | PowerWithout-GainAsymmetry | | PowerWithGainAsymmetry | | | PowerWithGainAsymEqualizer | | | PowerWithGainAsymEqualizer1 | | |
|---|---|---|---|---|---|---|---|---|---|---|---|---|---|
| | | | mean (dBm) | std (dB) | mean (dBm) | Mean error (dB) | std (dB) | mean (dBm) | mean error (dB) | std (dB) | mean (dBm) | mean error (dB) | std (dB) |
| G1 | 12 | 15 | −11.0535 | 0.0125 | −11.9273 | −0.8738 | 0.0313 | −11.0460 | 0.0075 | 0.0122 | −11.0990 | −0.0455 | 0.0123 |
| G2 | 12 | 12 | −11.0528 | 0.0140 | −11.8216 | −0.7688 | 0.0324 | −11.0477 | 0.0051 | 0.0150 | −10.9686 | 0.0842 | 0.0151 |
| G3 | 12 | 9 | −11.0550 | 0.0173 | −11.9384 | −0.8834 | 0.0344 | −11.0475 | 0.0075 | 0.0179 | −11.1126 | −0.0576 | 0.0179 |
| G4 | 12 | 6 | −11.0508 | 0.0170 | −11.8232 | −0.7724 | 0.0391 | −11.0456 | 0.0052 | 0.0148 | −10.9704 | 0.0804 | 0.0153 |
| G5 | 12 | 3 | −11.0552 | 0.0186 | −11.8665 | −0.8113 | 0.0401 | −11.0494 | 0.0058 | 0.0171 | −11.0214 | 0.0338 | 0.0174 |

| | RFFE gain | IF gain | PowerWithoutGainAsymmetry | | PowerWithGainAsymmetry | | | PowerWithGainAsymEqualizer | | | PowerWithGainAsymEqualizer1 | | |
|---|---|---|---|---|---|---|---|---|---|---|---|---|---|
| | | | mean (dBm) | std (dB) | mean (dBm) | Mean error (dB) | std (dB) | mean (dBm) | mean error (dB) | std (dB) | mean (dBm) | mean error (dB) | std (dB) |
| G6 | 12 | 0 | −11.0520 | 0.0151 | −11.8848 | −0.8328 | 0.0341 | −11.0456 | 0.0064 | 0.0158 | −11.0456 | 0.0064 | 0.0158 |
| G7 | 12 | −3 | −11.0543 | 0.0151 | −11.8351 | −0.7808 | 0.0361 | −11.0492 | 0.0051 | 0.0138 | −10.9850 | 0.0693 | 0.0140 |
| G8 | −6 | 12 | −11.0592 | 0.0158 | −11.5881 | −0.5289 | 0.0180 | −11.0582 | 0.0010 | 0.0159 | −10.9804 | 0.0788 | 0.0160 |
| G9 | −6 | 9 | −11.0540 | 0.0162 | −11.7054 | −0.6514 | 0.0180 | −11.0511 | 0.0029 | 0.0155 | −11.1170 | −0.0630 | 0.0155 |
| G10 | −6 | 6 | −11.0530 | 0.0114 | −11.5870 | −0.5340 | 0.0134 | −11.0516 | 0.0014 | 0.0108 | −10.9793 | 0.0737 | 0.0109 |
| G11 | −6 | 3 | −11.0517 | 0.0149 | −11.6210 | −0.5693 | 0.0185 | −11.0500 | 0.0017 | 0.0163 | −11.0191 | 0.0326 | 0.0163 |
| G12 | −6 | 0 | −11.0544 | 0.0182 | −11.6492 | −0.5948 | 0.0215 | −11.0522 | 0.0022 | 0.0207 | −11.0522 | 0.0622 | 0.0207 |
| G13 | −6 | −3 | −11.0576 | 0.0141 | −11.5996 | −0.5420 | 0.0151 | −11.0561 | 0.0015 | 0.0136 | −10.9935 | 0.0641 | 0.0135 |
| G14 | −6 | −6 | −11.0541 | 0.0172 | −11.6117 | −0.5576 | 0.0174 | −11.0524 | 0.0017 | 0.0138 | −11.0077 | 0.0464 | 0.0138 |

The measurement condition "PowerWithoutGainAsymmetry" means that the transmit power is measured when the transmit power detection path has no gain asymmetry. The measurement condition "PowerWithGainAsymmetry" means that the transmit power is measured when the transmit power detection path has gain asymmetry. The measurement condition "PowerWithGainAsymEqualizer" means that the transmit power is measured when the transmit power detection path has gain asymmetry and filter coefficients of the programmable filter device are adjusted for each gain step of the transmitter power detection path. The measurement condition "PowerWithGainAsymEqualizer1" means that the transmit power is measured when the transmit power detection path has gain asymmetry and filter coefficients of the programmable filter device are adjusted for each group of gain steps of the transmitter power detection path. As shown in above table, the transmit power detection path supports a plurality of gain steps G1-G14. The items in bold indicates that the measurement accuracy requirement is not met when no programmable filter device is employed to equalize the asymmetry frequency response of the transmit power detection path. In a case where filter coefficients of the programmable filter device are adjusted for each gain step of the transmitter power detection path, the measurement accuracy requirement is met for each gain step. In another case where filter coefficients of the programmable filter device are adjusted for each group of gain steps of the transmitter power detection path, the filter coefficients particularly designed for the gain step G6 are used for each of gain steps G1-G7, and the filter coefficients particularly designed for the gain step G12 are used for each of gain steps G8-G14. As can be seen from the table, the measurement accuracy requirement is still met for each gain step.

It should be noted that the frequency response curves shown in FIG. 4 and the power measurement results shown in above table are for illustrative purposes only, and are not meant to be limitations of the present invention. For example, the frequency response of the transmitter power detection path is not fixed due to the fact that the transmitter power detection path has gain asymmetry variation when the operating condition changes.

For better understanding of technical features of the present invention, several exemplary power measurement configurations each based on the architecture shown in FIG. 2 are provided.

Figure 5:
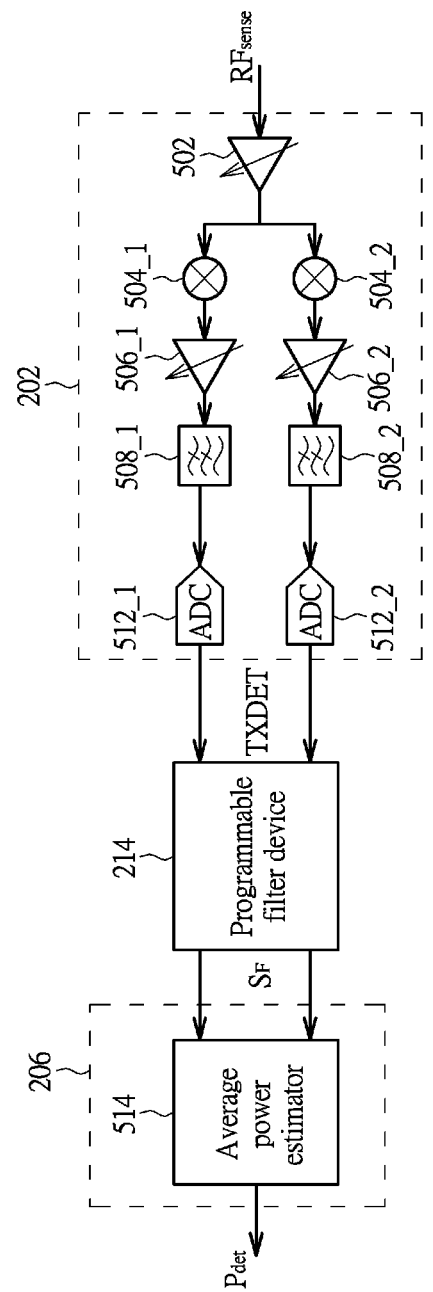
FIG. 5 is a diagram illustrating a power measurement configuration using absolute power tracking according to an embodiment of the present invention.

FIG. 5 is a diagram illustrating a power measurement configuration using absolute power tracking according to an embodiment of the present invention. The transmit power detection path 202 shown in FIG. 2 may be implemented using amplifiers 502, 506_1, 506_2, mixers 504_1, 504_2, analog filters 508_1, 508_2, and ADCs 512_1, 512_2. It should be noted that the ADC sampling rate is sufficiently high for the input transmit signal derived from the RF sensing signal $RF_{sense}$. In this embodiment, the tracking circuit 206 shown in FIG. 2 may be implemented using an average power estimator 514. The programmable filter device 214 may be a programmable complex filter coupled between the transmit power detection path 202 and the tracking circuit 206. Hence, the programmable filter device 214 generates the filter output $S_F$ to the average power estimator 514 by processing the transmit power detection signal TXDET generated from the transmit power detection path 202. Specifically, the programmable filter device 214 is set by the compensation controller 216 to act as an equalizer used to equalize the frequency response of the transmit power detection path 202. For example, the frequency response of the programmable filter device 214 may be set by an inverse of the frequency response of the transmit power detection path 202. In addition, the programmable filter device 214 may be a fullband filter for allowing power measurement across total assigned bandwidth, as shown in sub-diagram (A) of FIG. 3. The average power estimator 514 calculates an average power of the filter output $S_F$ as the transmit power tracking result $P_{det}$. Since the absolute power tracking is used, no reference path is needed.

Figure 6:
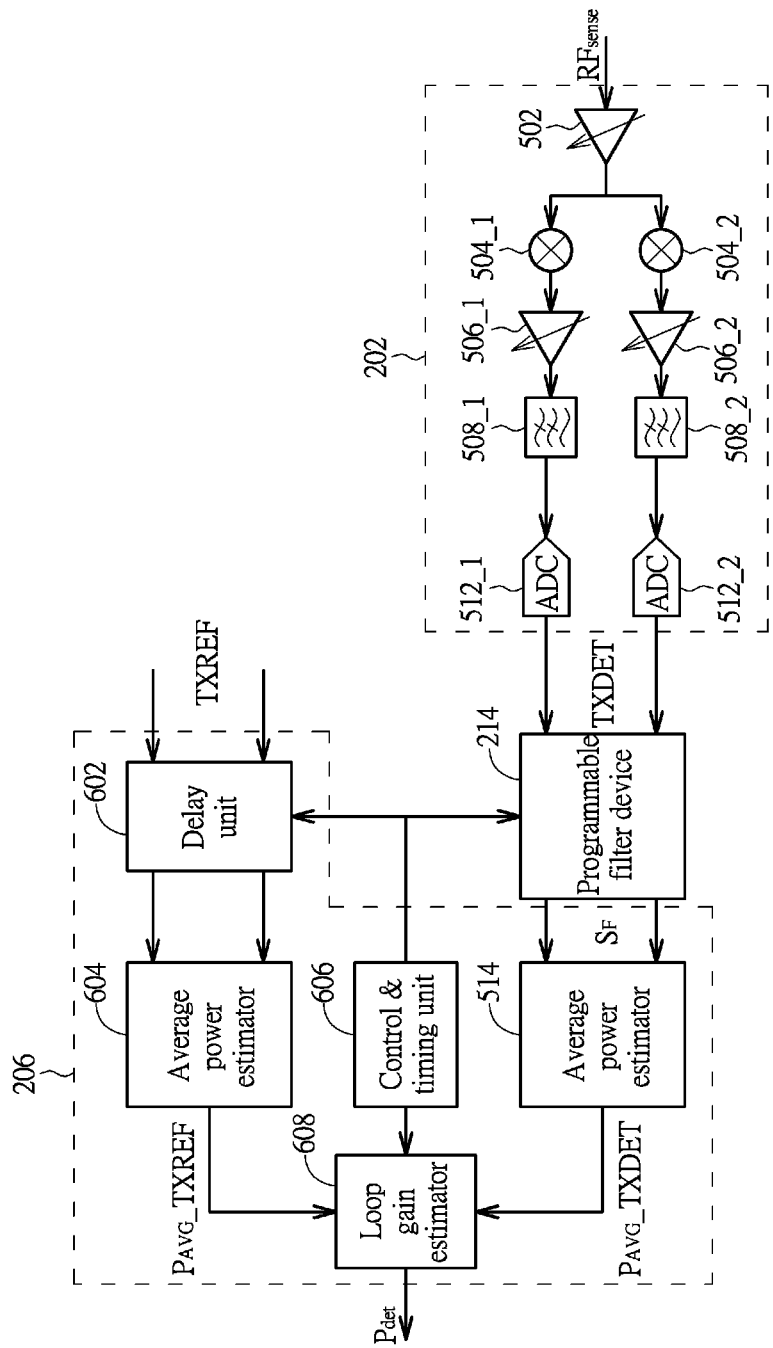
FIG. 6 is a diagram illustrating a power measurement configuration using loop gain tracking according to an embodiment of the present invention.

FIG. 6 is a diagram illustrating a power measurement configuration using loop gain tracking according to an embodiment of the present invention. The transmit power detection path 202 shown in FIG. 2 may be implemented using amplifiers 502, 506_1, 506_2, mixers 504_1, 504_2, analog filters 508_1, 508_2, and ADCs 512_1, 512_2. It should be noted that the ADC sampling rate is sufficiently high for the input transmit signal derived from the RF sensing signal $RF_{sense}$. In this embodiment, the tracking circuit 206 shown in FIG. 2 may be implemented using a delay unit 602, an average power estimator 604, a control & timing unit 606, a loop gain estimator 608, and the aforementioned average power estimator 514. The programmable filter device 214 may be a programmable complex filter coupled between the transmit power detection path 202 and the tracking circuit 206. Hence, the programmable filter device 214 generates the filter output $S_F$ to the average power estimator 514 by processing the transmit power detection signal TXDET generated from the transmit power detection path 202. Specifically, the programmable filter device 214 is set by the compensation controller 216 to act as an equalizer used to equalize the frequency response of the transmit power detection path 202. For example, the frequency response of the programmable filter device 214 may be set by an inverse of the frequency response of the transmit power detection path 202. In addition, the programmable filter device 214 may be a fullband filter for allowing power measurement across total assigned bandwidth, as shown in sub-diagram (A) of FIG. 3.

Since the loop gain tracking is used, a reference path for receiving and processing a reference transmit signal TXREF is needed. As shown in FIG. 6, the tracking circuit 206 further receives the reference transmit signal TXREF. The tracking circuit 206 generates the transmit power tracking result $P_{det}$ based on the filter output $S_F$ and the reference transmit signal TXREF. The control & timing unit 606 controls the delay time of the delay unit 602 according to the processing time needed by the programmable filter device 214. In this way, a time delayed version of the reference transmit signal TXREF and a frequency response compensated version of the transmit power detection signal TXDET will arrive at the average power estimators 604 and 514 simultaneously. The average power estimator 514 calculates an average power $P_{AVG}$_TXDET of the filter output $S_F$, i.e., the average power corresponding to the power transmit detection signal TXDET. The average power estimator 604 calculates an average power $P_{AVG}$_TXREF of the reference transmit signal TXREF. The loop gain estimator 608 refers to the average power $P_{AVG}$_TXDET corresponding to the transmit power detection signal TXDET and the average power $P_{AVG}$_TXREF of the reference transmit signal TXREF to calculate a loop gain as the transmit power tracking result $P_{det}$. For example, $P_{det}=P_{AVG}$_TXDET/$P_{AVG}$_TXREF. It should be noted that ADCs 512_1, 512_2 and the reference path may share the same clock tree, which allows simpler re-sampling and time alignment.

Figure 7:
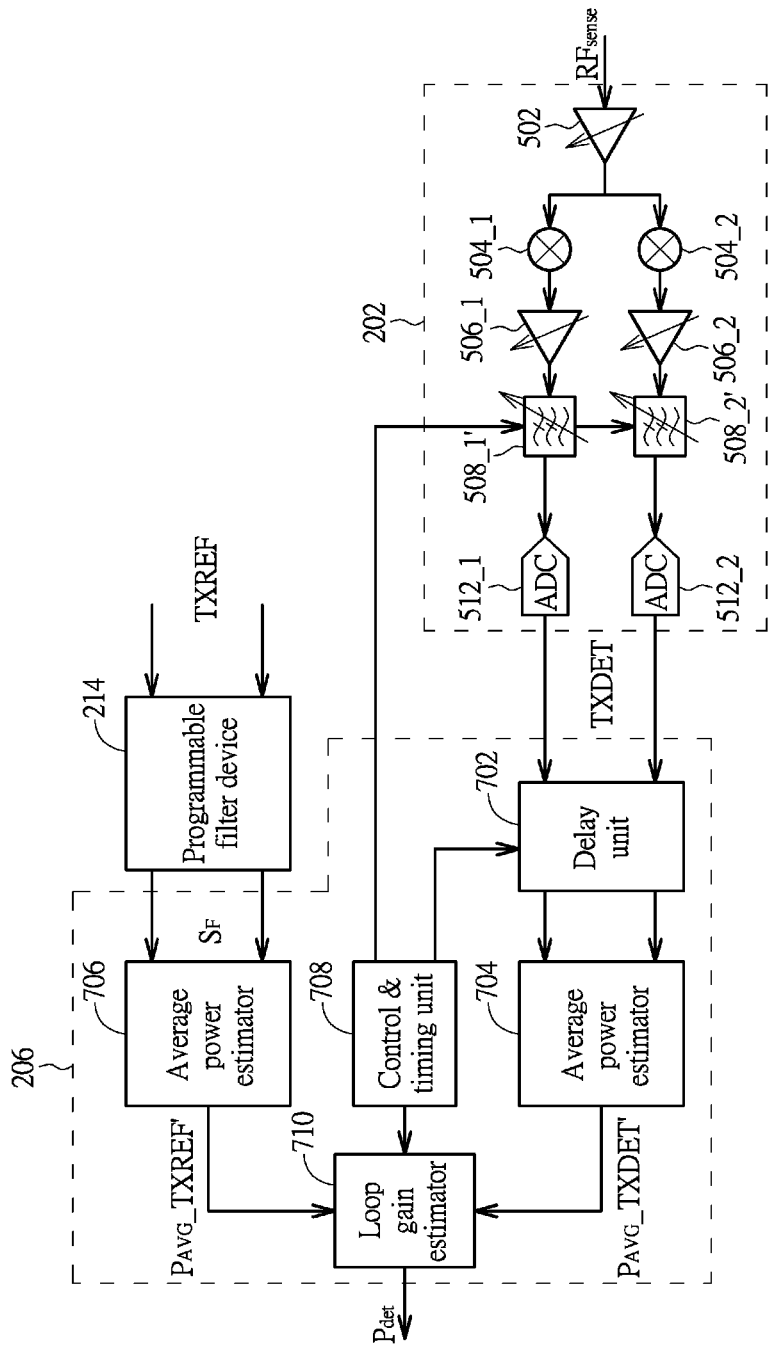
FIG. 7 is a diagram illustrating another power measurement configuration using loop gain tracking according to an embodiment of the present invention.

FIG. 7 is a diagram illustrating another power measurement configuration using loop gain tracking according to an embodiment of the present invention. The transmit power detection path 202 shown in FIG. 2 may be implemented using amplifiers 502, 506_1, 506_2, mixers 504_1, 504_2, programmable analog filters 508_1', 508_2', and ADCs 512_1, 512_2. It should be noted that the programmable analog filters 508_1', 508_2' are controlled to act as low-pass filters. Hence, the ADC sampling rate does not have to be sufficiently high for the input transmit signal derived from the RF sensing signal $RF_{sense}$. With the help of the programmable analog filters 508_1, 508_2, narrow bandwidth processing can be achieved in the transmit power measurement apparatus.

Since the loop gain tracking is used, a reference path for receiving and processing a reference transmit signal TXREF is needed. As shown in FIG. 7, the programmable filter device 214 may be a programmable complex filter used to receive the reference transmit signal TXREF and process the reference transmit signal TXREF to generate the filter output $S_F$. Specifically, the programmable filter device 214 is set by the compensation controller 216 to act as a low-pass filter, and is used to duplicate the frequency response of the transmit power detection path 202. Hence, the programmable filter device 214 and the programmable analog filters 508_1', 508_2' are narrowband filters for allowing power measurement within a portion of the assigned bandwidth, as shown in sub-diagram (C) of FIG. 3.

In this embodiment, the tracking circuit 206 shown in FIG. 2 may be implemented using a delay unit 702, average power estimators 704, 706, a control & timing unit 708, and a loop gain estimator 710. The tracking circuit 206 generates the transmit power tracking result $P_{det}$ based on the filter output $S_F$ and the transmit power detection signal TXDET. The control & timing unit 708 controls the delay time of the delay unit 702 according to the processing time needed by the programmable filter device 214. In this way, a time delayed version of the transmit power detection signal TXDET and a frequency response compensated version of the reference transmit signal TXREF will arrive at the average power estimators 704 and 706 simultaneously. In addition, the control & timing unit 708 further controls the programmable analog filters 508_1, 508_2 to act as low-pass filters.

The average power estimator 704 calculates an average power $P_{AVG}$_TXDET' of the transmit power detection signal TXDET. The average power estimator 706 calculates an average power $P_{AVG}$_TXREF' of the filter output $S_F$, i.e., the average power corresponding to the reference transmit signal TXREF. The loop gain estimator 710 refers to the average power $P_{AVG}$_TXDET' of the transmit power detection signal TXDET and the average power $P_{AVG}$_TXREF' corresponding to the reference transmit signal TXREF to calculate a loop gain as the transmit power tracking result $P_{det}$. For example, $P_{det}=P_{AVG}$_TXDET'/$P_{AVG}$_TXREF'. It should be noted that ADCs 512_1, 512_2 and the reference path may share the same clock tree, which allows simpler re-sampling and time alignment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transmit power measurement apparatus, comprising:
    a transmit power detection path;
    a compensation circuit, comprising:
        a programmable filter device, configured to generate a filter output; and
        a compensation controller, configured to set the programmable filter device at least based on a frequency response of the transmit power detection path; and
    a tracking circuit, configured to generate a transmit power tracking result at least based on the filter output.

2. The transmit power measurement apparatus of claim 1, further comprising:
    a calibration circuit, comprising:
        a test signal source, configured to generate a test transmit signal to the transmit power detection path when the transmit power detection path is operated in a calibration mode; and
        a frequency response detection circuit, configured to receive a test transmit power detection signal generated from the transmit power detection path in response to the test transmit signal, and obtain at least one detected frequency response of the transmit power detection path according to the test transmit signal and the test transmit power detection signal, wherein the frequency response of the transmit power detection path is selected from the at least one detected frequency response.

3. The transmit power measurement apparatus of claim 2, wherein the at least one detected frequency response includes a plurality of frequency responses determined by the frequency response detection circuit under different gain settings of the transmit power detection path.

4. The transmit power measurement apparatus of claim 2, wherein the at least one detected frequency response includes a plurality of frequency responses determined by the frequency response detection circuit under different operating bands.

5. The transmit power measurement apparatus of claim 1, wherein the programmable filter device is coupled between the transmit power detection path and the tracking circuit, and the programmable filter device generates the filter output by processing a transmit power detection signal generated from the transmit power detection path.

6. The transmit power measurement apparatus of claim 5, wherein the programmable filter device is set by the compensation controller to equalize the frequency response of the transmit power detection path.

7. The transmit power measurement apparatus of claim 5, wherein the tracking circuit calculates an average power of the filter output as the transmit power tracking result.

8. The transmit power measurement apparatus of claim 5, wherein the tracking circuit is further configured to receive a reference transmit signal; and the transmit power tracking result is generated based on the filter output and the reference transmit signal.

9. The transmit power measurement apparatus of claim 8, wherein the tracking circuit calculates an average power of the filter output, calculates an average power of the reference transmit signal, and refers to the average power of the filter output and the average power of the reference transmit signal to calculate a loop gain as the transmit power tracking result.

10. The transmit power measurement apparatus of claim 1, wherein the programmable filter device is further configured to receive a reference transmit signal; the programmable filter device generates the filter output by processing the reference transmit signal; and the transmit power tracking result is generated based on the filter output and a transmit power detection signal generated from the transmit power detection path.

11. The transmit power measurement apparatus of claim 10, wherein the programmable filter device is set by the compensation controller to duplicate the frequency response of the transmit power detection path.

12. The transmit power measurement apparatus of claim 10, wherein the tracking circuit calculates an average power of the filter output, calculates an average power of the transmit power detection signal, and refers to the average power of the filter output and the average power of the transmit power detection signal to calculate a loop gain as the transmit power tracking result.

13. A transmit power measurement method, comprising:
    setting a programmable filter device at least based on a frequency response of a transmit power detection path;
    generating a filter output by utilizing the programmable filter device;
    generating a transmit power tracking result at least based on the filter output; and
    when the transmit power detection path is operated in a calibration mode, generating a test transmit signal to the transmit power detection path, receiving a test transmit power detection signal generated from the transmit power detection path in response to the test transmit signal, and obtaining at least one detected frequency response of the transmit power detection path according to the test transmit signal and the test transmit power detection signal, wherein the frequency response of the transmit power detection path is selected from the at least one detected frequency response.

14. The transmit power measurement method of claim 13, wherein the at least one detected frequency response includes a plurality of frequency responses determined under different gain settings of the transmit power detection path.

15. The transmit power measurement method of claim 13, wherein the at least one detected frequency response includes a plurality of frequency responses determined under different operating bands.

16. A transmit power measurement method, comprising:
    setting a programmable filter device at least based on a frequency response of a transmit power detection path;
    utilizing the programmable filter device to generate a filter output by processing a transmit power detection signal generated from the transmit power detection path;
    receiving a reference transmit signal;
    calculating an average power of the filter output;
    calculating an average power of the reference transmit signal; and
    referring to the average power of the filter output and the average power of the reference transmit signal to calculate a loop gain as the transmit power tracking result.

17. The transmit power measurement method of claim 16, wherein the step of setting the programmable filter device comprises:
    setting the programmable filter device to equalize the frequency response of the transmit power detection path.

18. A transmit power measurement method, comprising:
    setting a programmable filter device at least based on a frequency response of a transmit power detection path;
    generating a filter output by utilizing the programmable filter device; and
    generating a transmit power tracking result at least based on the filter output;
    wherein the step of generating the filter output comprises:
    receiving a reference transmit signal; and
    utilizing the programmable filter device to generate the filter output by processing the reference transmit signal; and
    the step of generating the transmit power tracking result comprises:
    generating the transmit power tracking result based on the filter output and a transmit power detection signal generated from the transmit power detection path.

19. The transmit power measurement method of claim 18, wherein the step of setting the programmable filter device comprises:
    setting the programmable filter device to duplicate the frequency response of the transmit power detection path.

20. The transmit power measurement method of claim 18, wherein the step of generating the transmit power tracking result based on the filter output and the transmit power detection signal comprises:
    calculating an average power of the filter output;
    calculating an average power of the transmit power detection signal; and
    referring to the average power of the filter output and the average power of the transmit power detection signal to calculate a loop gain as the transmit power tracking result.

* * * * *